(12) United States Patent
Kim et al.

(10) Patent No.: US 6,466,501 B2
(45) Date of Patent: Oct. 15, 2002

(54) SEMICONDUCTOR MEMORY DEVICE HAVING SENSE AMPLIFIER AND METHOD FOR DRIVING SENSE AMPLIFIER

(75) Inventors: Si Hong Kim, Kyoungki-do (KR); Sang Hoon Hong, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/891,507

(22) Filed: Jun. 27, 2001

(65) Prior Publication Data

US 2002/0003734 A1 Jan. 10, 2002

(30) Foreign Application Priority Data

Jun. 28, 2000 (KR) .............................. 00-36157
May 23, 2001 (KR) .............................. 01-28267

(51) Int. Cl.[7] ................................. G11C 7/02
(52) U.S. Cl. ........................ 365/207; 365/205
(58) Field of Search .................. 365/205, 207, 365/208, 203, 222; 327/51, 52

(56) References Cited

U.S. PATENT DOCUMENTS 4,922,461 A * 5/1990 Hayakawa et al. .... 365/230.08
5,650,971 A * 7/1997 Longway et al. ........... 365/207
6,181,621 B1 * 1/2001 Lovett ........................ 365/154
6,215,713 B1 * 4/2001 Austin ........................ 365/205
6,272,059 B1 * 8/2001 Ryu et al. ................... 365/205
6,304,505 B1 * 10/2001 Forbes et al. ............... 365/205
6,317,374 B2 * 11/2001 Feurle

* cited by examiner

Primary Examiner—Hoai Ho
Assistant Examiner—Gene N. Auduong
(74) Attorney, Agent, or Firm—Pillsbury Winthrop LLP

(57) ABSTRACT

A semiconductor memory device with a sense amplifier of the present invention reduces an offset voltage between input and output terminals of the sense amplifier to improve sensing sensitivity, whereby improving cell density of the device as well as achieving a stable operation in low voltage. For the purpose of achieving the foregoing objects, the semiconductor memory device with the sense amplifier includes a plurality of switch means for sequentially turning an amplifying method of the sense amplifier to rapidly sense and sufficiently amplify the data loaded on a bit line in response to a plurality of switch control signals.

8 Claims, 5 Drawing Sheets

SEMICONDUCTOR MEMORY DEVICE HAVING SENSE AMPLIFIER AND METHOD FOR DRIVING SENSE AMPLIFIER

FIELD OF THE INVENTION

The present invention generally relates to a semiconductor memory device having a sense amplifier for sensing and data of memory cell, and more specifically to a semiconductor memory device having a sense amplifier of which an amplifying method is sequentially turned by using a switch element controlled by a switch control signal and thus compensating for offset voltage between input and output terminals.

BACKGROUND OF THE INVENTION

In general, a bit line sense amplifier senses and amplifies data loaded on bit line, and then provides the amplified data for data bus. Also a data bus sense amplifier senses and amplifies again the amplified data on data bus line and provides it for data output buffer. Here, the bit line sense amplifier employs a cross-coupled latch type amplifier.

The operation of the general bit line sense amplifier will be explained hereinafter.

First, the bit line is precharged to a precharge voltage (for example, a half of internal power supply voltage VDD). At that time, a pair of bit lines are equalized in order to eliminate voltage difference between a bit line connected to a selected memory cell and the other bit line.

A row decoder receives a row address from the outside of the semiconductor memory device and selects a word line corresponding to the row address. Then, cell transistors connected to the selected word line are turned on, causing a charge share between cell capacitance and bit line capacitance to be conductive. Thus, a potential difference is established between the bit line connected to the selected memory cell and the other bit line.

If sense amp control signals RTO and /S are enabled, i.e. the signal RTO goes up to a high level (e.g., VDD), and the signal /S falls down to a low level (e.g., VSS), the bit line sense amplifier achieves an operation for sensing and amplifying the potential difference between the bit line connected to the selected memory cell and the other bit line.

For instance, assuming that the data stored in the selected memory cell is at a low level, the potential of the bit line connected to the selected cell becomes lower than the precharge voltage. Since the other bit line retains the precharge voltage, the potential difference between two bit lines is resulted.

Thus, the bit line sense amplifier of cross-coupled latch type amplifier makes the bit line connected to the selected memory cell be at a low level VSS in response to the sense amp control signal /S, and the other bit line be at a high level VDD in response to the sense amp control signal RTO.

Next, if column decoder analyzes column address, and lets column control signal YI corresponding to the column address be enabled to a high level, the bit line sense amplifier activated by the column control signal YI transmits the amplified data onto the data bus.

However, when the conventional sense amplifier operates under a condition that a source voltage is lower than normal voltage, it cannot achieve the stable operation when sensing the data loaded on the bit line due to the offset voltage between the bit line and the sense amplifier. As a result, it takes a lot of time to sufficiently amplify the data on the bit line.

Under the condition of a low voltage, capacitance of the bit line becomes to be bigger than the cell. At the charge distribution the potential difference between the bit line connected to the selected memory cell and the other bit line decreases.

Thus, in case that the bit line sense amplifier senses a small voltage difference between the bit line connected to the selected memory cell and the other bit line, the operation thereof slows down due to the small voltage difference similar to the offset voltage. If the voltage difference is less than the offset voltage, the bit line sense amplifier may fail to sense the data, resulting in data error.

SUMMARY OF THE INVENTION

It is, therefore, an object of the present invention to improve sensing sensitivity and sufficiently amplify the data loaded on bit line, by changing an amplifying method of the sense amplifier.

It is another object of the present invention to achieve the stable operation by compensating for an offset voltage between input and output terminals of the sense amplifier in a semiconductor memory device.

In order to attain the above objects, according to an aspect of the present invention, there is provided a semiconductor memory device with a sense amplifier which is enabled in response to a sense amp control signal, and senses and amplifies data loaded on a bit line with using a predetermined power supply voltage. The sense amplifier includes switching means for changing a plurality of methods of amplifying the data. The amplifying method turns to a negative feedback differential amplifying method, a normal differential amplifying method, a positive feedback differential amplifying method, and a cross-coupled latch type amplifying method, in sequence.

According to another aspect of this invention, there is provided a method for driving a sense amplifier sensing and amplifying data loaded on bit line in a semiconductor memory device. The method comprises the steps of in sequence: turning an amplifying method of the sense amplifier into a negative feedback differential amplifying method for the purpose of compensating for an offset voltage between input and output terminals; turning an amplifying method of the sense amplifier into a normal differential amplifying method and amplifying the data loaded on the bit line; turning an amplifying method of the sense amplifier into a positive feedback differential amplifying method, compensating for an offset voltage between the input and output terminals, and re-amplifying the data amplified in the normal differential amplifying step; and turning an amplifying method of the sense amplifier into a cross-coupled latch method and then latching the data amplified in the positive feedback differential amplifying step.

The foregoing features and advantages of the invention will be more fully described in the accompanying drawings.

BRIEF DESCRIPTION OF THE DRAWINGS

The above and other objects, features and advantages of the present invention will become more apparent from the following detailed description when taken in conjunction with the accompanying drawings in which.

DESCRIPTION OF THE PREFERRED EMBODIMENT

In the following description for purposes of explanation, specific numbers, materials and configurations are set forth in order to provide a thorough understanding of the present invention. However, it will be apparent to one skilled in the art that the present invention may be practiced without the specific without the specific details. In other instances, well-known systems are shown in diagrammatic or block diagram form in order not to obscure the present invention.

Figure 1:
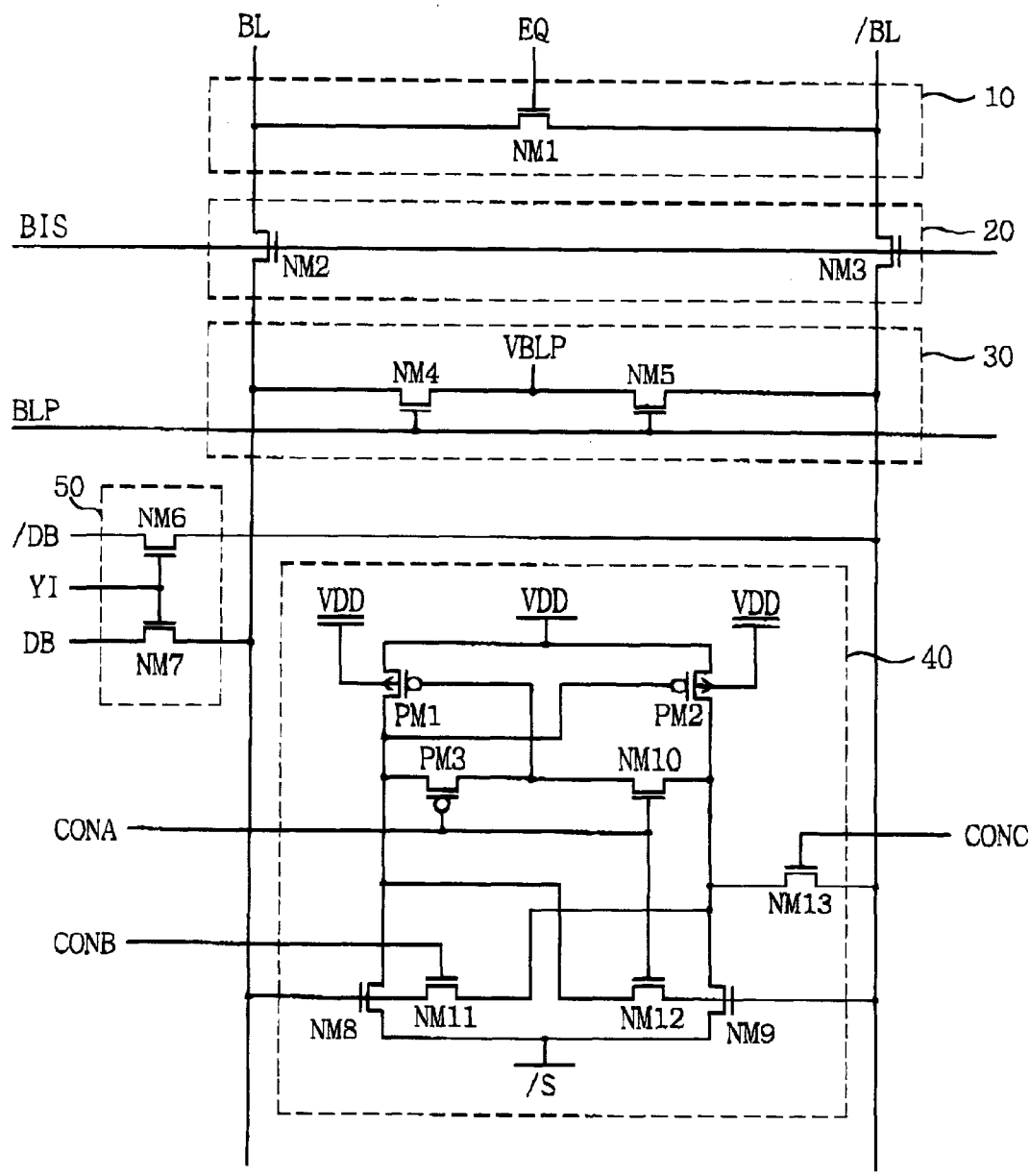
FIG. 1 is a circuit diagram of a semiconductor memory device having a sense amplifier according to one embodiment of the present invention.

FIG. 1 is a circuit diagram showing a semiconductor memory device having a sense amplifier according to a preferred embodiment of the present invention.

Referring first to FIG. 1, the semiconductor memory device with the sense amplifier includes an equalize control unit 10, a separate control unit 20, a precharge unit 30, a sense amplifier 40, and an output control unit 50. The equalize control unit 10 equalizes bit lines BL and /BL in response to an equalize control signal EQ. The separate control unit 20 selectively separates the bit lines BL and /BL in memory cell array region from the bit lines BL and /BL in sense amplifier region in response to separate control signal BIS. The precharge unit 30 precharges the bit lines BL and /BL with precharge voltage VBLP in response to precharge control signal BLP. The sense amplifier 40 senses and amplifies the data loaded on the bit line BL in response to sense amp control signal /S. The output control unit 50 selectively transfers the data amplified by the sense amplifier 40 to data buses DB and /DB in response to column select signal YI.

The equalize control unit 10 includes N-channel metal oxide semiconductor (NMOS) transistor NM1, having a gate controlled by the equalize control signal EQ, connected between the bit lines BL and /BL. The separate control unit 20 includes NMOS transistors NM2 and NM3 coupled to the separate control signal BIS through gates, and there of respectively connected to on alternative one of the bit lines BL or /BL. The precharge unit 30 includes NMOS transistors NM4 and NM5 connected between the bit lines BL and /BL. The NMOS transistors NM4 and NM5 have gates to which the precharge control signal BLP is applied in common. The precharge voltage VBLP is applied to a common node between the NMOS transistors NM4 and NM5.

The sense amplifier 40 includes P-channel MOS transistors PM1 through PM3, and NMOS transistors NM8~NM13. The PMOS transistors PM1 and PM2 have a common source to which internal power supply voltage VDD is applied, and gate of the PMOS transistor PM2 is coupled to drain of the PMOS transistor PM1. The NMOS transistors NM8 and NM9 have drains respectively connected to the drains of the PMOS transistors PM1 and PM2, gates respectively coupled to the bit lines BL and /BL, and commonly connected sources to which the sense amp control signal /S is applied. The PMOS transistor PM3 and the NMOS transistor NM10, serially connected between the drains of PMOS transistors PM1 and PM2, have gates where the switch control signal CONA is applied, a common electrode where the gate of the PMOS transistor PM1 is coupled. The NMOS transistor NM11 has a gate where the switch control signal CONB is applied, a drain commonly coupled to the drain of the PMOS transistor PM2, and a source connected to the bit line /BL. The NMOS transistor NM12 has a gate where the switch control signal CONA is applied, a drain commonly coupled to the drain of the PMOS transistor PM1, and a source connected to the bit line /BL. The NMOS transistor NM13 has a gate where the switch control signal CONC is applied, and is connected between the drain of the PMOS transistor PM2 and the bit line /BL.

Here, the PMOS transistors PM1 and PM2 and NMOS transistors NM8 and NM9 are basic component elements for the sense amplifier 40, and the PMOS transistor PM3 and the NMOS transistors NM10, NM11, NM12, and NM13 controlled by the switch control signals CONA, CONB, and CONC are switch elements for sequentially turning the amplifying method of the sense amplifier 40 into negative feedback differential amplifying, normal differential amplifying, positive feedback amplifying, and cross-coupled latch type amplifying methods. In particular, the NMOS transistors NM11, NM12, and NM13 are also utilized as the switch elements for reducing the offset voltage between input and output terminals of the sense amplifier 40.

The output control unit 50 includes NMOS transistors NM6 and NM7 whose gates are coupled to the column select signal YI for selectively transferring the data loaded on the bit lines BL and /BL to the data buses DB and /DB.

The operation of the semiconductor memory device having the sense amplifier will be explained with reference to a timing diagram of FIG. 2.

Figure 2:
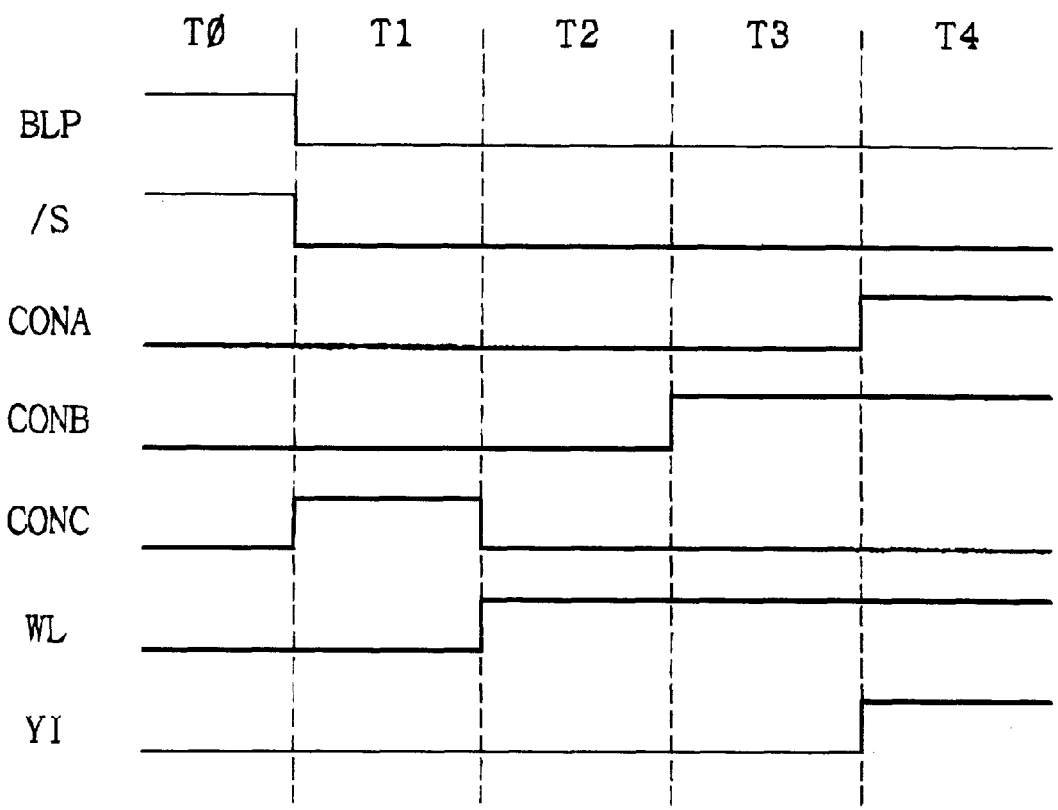
FIG. 2 is an operational timing diagram of the semiconductor memory device having the sense amplifier shown in FIG. 1.

As shown in FIG. 2, a period T0 is a stand-by step for driving the sense amplifier. In the period T0, the bit lines BL and /BL are precharged to the precharge voltage VBLP in response to the precharge control signal BLP being enabled to a high level, before the semiconductor memory device achieves read or write operation. Further, for the purpose of eliminating the voltage difference between the bit lines BL and /BL, the equalize control signal EQ is enabled to a high level, so that the bit lines BL and /BL are connected for each other and equalized. At that time, the sense amp control signal /S is precharged to the precharge voltage VBLP in the same method.

In periods T1 through T4, the sense amplifier 40 is enabled. The amplifying methods of the sense amplifier 40 are sequentially turned into the negative feedback differential amplifying method in T1, the normal differential amplifying method in T2, the positive amplifying method in T3, and the cross-coupled latch type method in T4.

In the period of T1, the precharge control signal BLP is disabled to a low level, and the sense amp control signal /S is enabled to a low level, thereby operating the sense amplifier 40.

At that time, since the switch control signals CONA and CONB go down to a low level, the PMOS transistor PM3 is turned on to connect the gate of the PMOS transistor PM1 to the drain. Thus, the sense amplifier 40 forms a differential amplifier type.

In addition, since the switch control signal CONC goes up to a high level, the NMOS transistor NM13 is turned on. Thus, the bit line /BL that is inverted input terminal of the sense amplifier 40 is connected to the drain that is non-inverted output terminal to which the PMOS transistor PM2 and NMOS transistor NM9 are commonly connected, and thus the amplifier 40 forms a negative feedback differential amplifier type.

Thus, the potential of the bit line /BL adjusts to a voltage compensating for the offset voltage between the inverted input terminals of the sense amplifier 40.

Next, in the period of T2, the switch control signal CONC goes down to a low level, so that the NMOS transistor NM13 is turned off. Since the other switch control signals CONA and CONB are at a low level, the sense amplifier 40 forms a normal differential amplifier type.

Here, the word line WL is enabled, and thus the data stored in the selected memory cell is loaded on the bit line BL. Thus, the data loaded on the bit line BL is sensed and amplified by the sense amplifier 40 of the normal differential amplifier type.

Here, since the switch control signal CONB is at a low level, the NMOS transistors NM11 and NM12 are turned off. Thus, the output terminal of the sense amplifier 40 is isolated from the bit lines BL and /BL that are the input terminals of the sense amplifier 40, and is not affected from the offset voltage between the input and the output terminals.

Next, in the period of T3, the switch control signal CONB goes up to a high level, so that the NMOS transistor NM11 is turned on. Thus, the bit line BL that is the non-inverted input terminal of the sense amplifier 40 is connected to the drain that is the non-inverted output terminal to which the PMOS transistor PM2 and the NMOS transistor NM9 are commonly connected. The other switch control signals CONA and CONC are at a low level, and the sense amplifier 40 forms a positive feedback differential amplifier type.

Hence, the data loaded on the bit line BL is sensed and amplified compensating for the offset voltage between the drain that is the non-inverted output terminal where the PMOS transistor PM2 and the NMOS transistor NM9 are commonly connected, and the bit line BL that is non-inverted input terminal.

Afterwards, in the period of T4, the switch control signal CONA goes up to a high level, so that the PMOS transistor PM3 is turned off, and the NMOS transistor NM10 is turned on. The switch control signal CONB goes up to a high level, so that the NMOS transistors NM1 and NM12 are turned on. Since the switching control signal CONC is at a low level, the NMOS transistor NM13 stays in the turn-off state. Thus, the sense amplifier 40 forms a cross-coupled latch type, and rapidly latches the data amplified in the former step.

At that time, the column signal YI is enabled to a high level, and thus the latched data is provided for the data buses DB and /DB.

Figure 3:
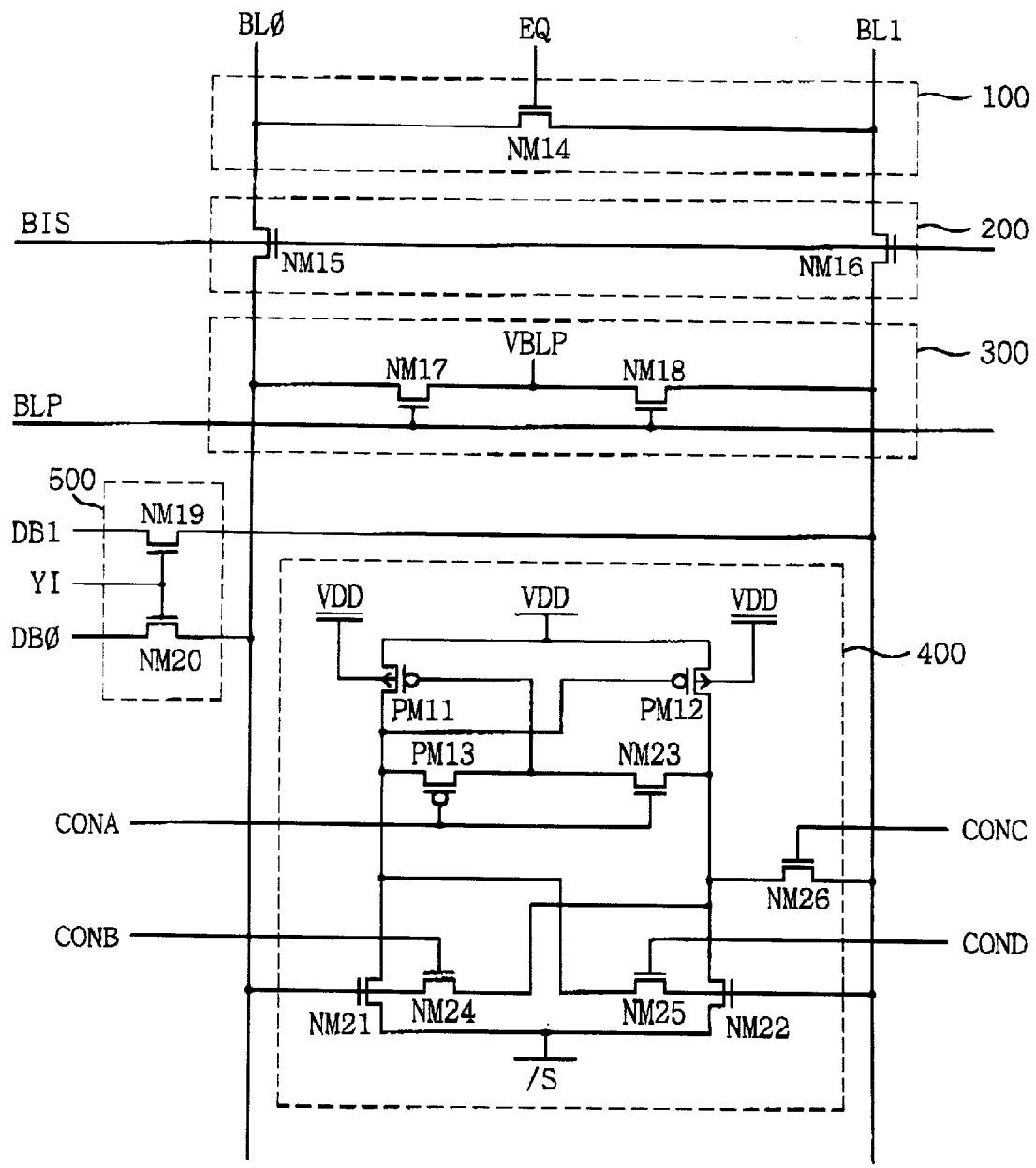
FIG. 3 is a circuit diagram of a semiconductor memory device having a sense amplifier according to another embodiment of the present invention.

FIG. 3 is a circuit diagram of a semiconductor memory device having a bit line sense amplifier according to another embodiment of the present invention.

As shown in FIG. 3, the semiconductor memory device with the sense amplifier includes an equalize control unit 100, a separate control unit 200, a precharge unit 300, a sense amplifier 400, and an output control unit 500. The equalize control unit 100 equalizes bit lines BL0 and BL1 in response to the equalize control signal EQ. The separate control unit 200 selectively separates the bit lines BL0 and BL1 in memory cell array region and the bit lines BL0 and BL1 in sense amplifier region in response to the separate control signal BIS. The precharge section 300 precharges the bit lines BL0 and BL1 to the precharge voltage VBLP in response to the precharge control signal BLP. The sense amplifier 400 senses and amplifies data loaded on the bit lines BL0 and BL1 in response to the sense amp control signal /S. The output control unit 500 selectively transmits the amplified data in the sense amplifier 400 to data buses DB0 and DB1 in response to the column select signal YI.

The equalize control unit 100 includes NMOS transistor NM14 that is coupled to the equalize control signal EQ through a gate and placed between the bit lines BL0 and BL1. The separate control unit 200 includes NMOS transistors NM15 and NM16 coupled to the separate control signal BIS through gates, and serially placed between the bit lines BL0 and BL1. The precharge unit 300 includes NMOS transistors NM17 and NM18 placed between the bit lines BL0 and BL1. The NMOS transistors NM17 and NM18 have gates where the precharge control signal BLP is applied. A common node between the NMOS transistors NM17 and NM18 is connected to the precharge voltage VBLP. The sense amplifier 400 includes PMOS transistor PM11~PM13 and NMOS transistors NM21~NM26.

The PMOS transistors PM11 and PM12 have commonly connected sources to which the internal power supply voltage VDD is applied, and gate of the PMOS transistor PM12 is connected to drain of the PMOS transistor PM11.

The NMOS transistors NM21 and NM22 have drains, each being connected to the drains of the PMOS transistors PM11 and PM12, gates respectively coupled to the bit lines BL0 and BL1, and commonly connected sources where the sense amp control signal /S is applied.

The PMOS transistor PM13 and the NMOS transistor NM23 have gates where the switch control signal CONA is applied, and are serially connected between the drains of the PMOS transistors PM11 and PM12. To commonly connected electrode of the transistors PM13 and NM20 the gate of the PMOS transistor PM11 is coupled.

The NMOS transistor NM24 has a gate where the switch control signal CONB is applied, a drain commonly coupled to the drain of the PMOS transistor PM12, and a source connected to the bit line BL0.

The NMOS transistor NM25 has a gate where the switch control signal COND is applied, a drain commonly coupled to the drain of the PMOS transistor PM11, and a source connected to the bit line BL1.

The NMOS transistor NM26 has a gate where the switch control signal CONC is applied, and is connected between the drain of the PMOS transistor PM12 and the bit line BL1.

Here, the PMOS transistors PM11 and PM12 and the NMOS transistors NM21 and NM22 are basic component elements for the sense amplifier 400, and the PMOS transistor PM13 and the NMOS transistors NM23, NM24, NM25, and NM26, controlled by the switch control signals CONA, CONB, CONC, and COND, are switch elements for sequentially turning the amplifying method of the sense amplifier 400 into the negative feedback differential amplifying, the normal differential amplifying, the positive differential amplifying, and the cross-coupled latch type amplifying methods. In particular, the NMOS transistors NM24, NM25, and NM26 are also used as switch elements for reducing the offset voltage between the input and output terminals of the sense amplifier 400.

The output control unit 500 includes NMOS transistors NM19 and NM20 whose gate is coupled to the column select signal YI for selectively transmitting the data loaded on the bit line BL0 and BL1 to the data buses DB0 and DB1.

The operation of the foregoing semiconductor memory device with the sense amplifier will be explained with reference to FIGS. 4A and 4B hereinafter.

Period of T0 is a stand-by step for driving the sense amplifier. The precharge signal BLP is enabled to a high level, so that the bit lines BL0 and BL1 is precharged to the precharge voltage VBLP, before the semiconductor memory device achieves a read or write operation.

Further, for the purpose of eliminating the voltage difference between the bit lines BL0 and BL1, the equalize control signal EQ is enabled to a high level, so that the bit lines are connected for each other and equalized. In this manner, the sense amp control signal /S is precharged to the precharge voltage VBLP.

During periods of T1~T4, the sense amplifier 400 is enabled. The amplifying method of the sense amplifier 400 is sequentially turned into the negative feedback differential amplifying method in the period T1, the normal differential amplifying method in the period T2, the positive feedback amplifying method in the period T3, and the cross-coupled latch type amplifying method in the period T4 in response to the switch control signals CONA, CONB, CONC, and COND for each period.

Figure 4A:
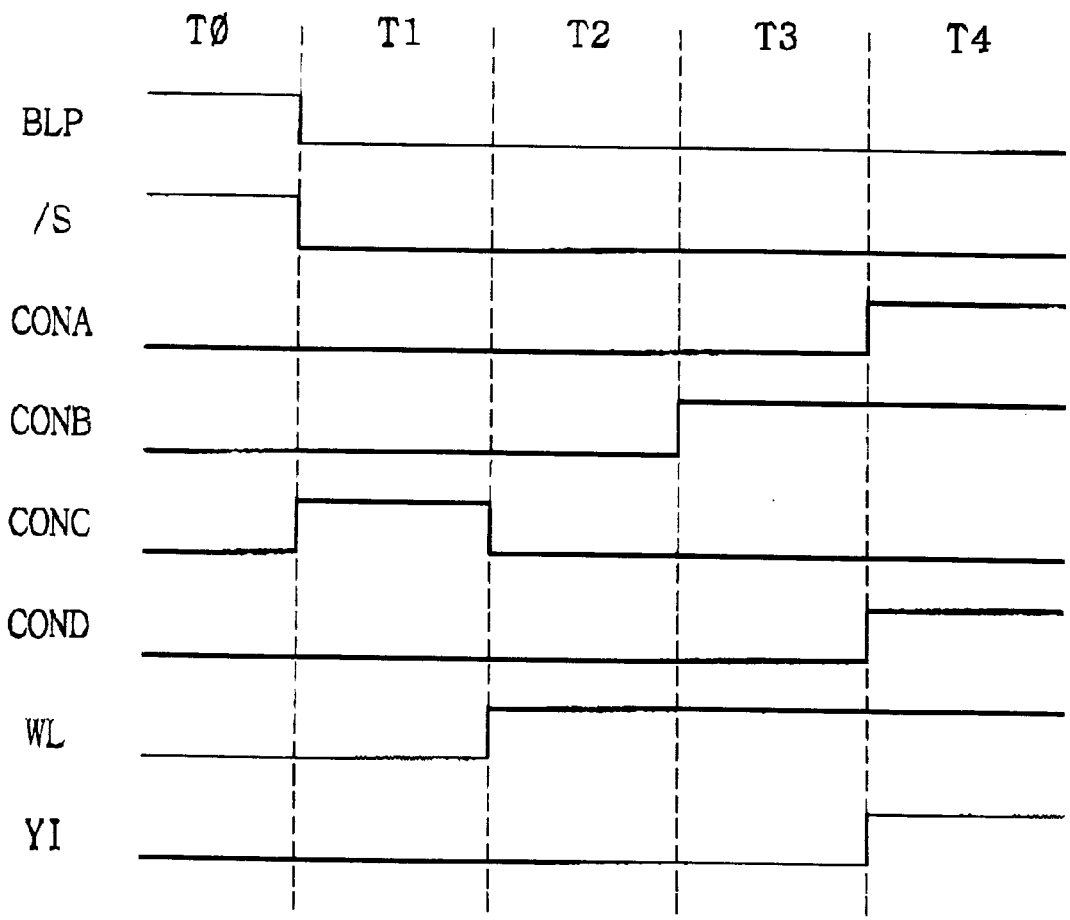
FIG. 4A is an operational timing diagram of a case that data is loaded on bit line BL0 shown in FIG. 3.

FIG. 4A is a timing diagram showing the operation of the semiconductor memory device having the sense amplifier in case that a memory cell connected to the bit line BL0 is selected.

In the period of T1, the precharge control signal BLP is disabled to a low level, and the sense amp control signal /S is enabled to a low level. Thus, the sense amplifier 400 starts to operate. At that time, the switch control signals CONA, CONB, and COND go down to a low level, so that the PMOS transistor PM3 is turned on. Thus, the gate of the PMOS transistor PM1 is commonly connected to the drain, and the sense amplifier 400 forms a differential amplifier type.

Further, the switch control signal CONC goes up to a high level, so that the NMOS transistor NM26 is turned on. The bit line BL1 that is the inverted input terminal of the sense amplifier 400 is connected to a drain that is the non-inverted output terminal to which the PMOS transistor PM12 and the NMOS transistor NM22 are commonly connected, so that the sense amplifier 400 forms the negative feedback differential amplifier type.

Thus, a potential of the bit line BL1 adjusts to a voltage for compensating for the offset voltage between the inverted input terminals of the sense amplifier 400.

Next, in the period of T2, the switch control signal CONC goes down to a low level, so that the NMOS transistor NM26 is turned off. Since the other switch control signals CONA, CONB, and COND are at a low level, the sense amplifier 400 forms the normal differential amplifier type.

Here, the word line WL is enabled, so that data stored in selected memory cell is loaded on the bit line BL0. The data loaded on the bit line BL0 is sensed and amplified by the sense amplifier 400 of the normal differential amplifier type.

Since the switch control signals CONB and COND are at a low level, the NMOS transistors NM24 and NM25 are turned off. Thus, the output terminal of the sense amplifier 400 is isolated from the bit lines BL0 and BL1 that are the input terminals, and is not affected by the offset voltage between the input and output terminals of the sense amplifier 400.

Next, in the period of T3, the switch control signal CONB goes up to a high level, so that the NMOS transistor NM24 is turned on. Thus, the bit line BL0 that is the non-inverted input terminal of the sense amplifier 400 is connected to the drain that is the non-inverted output terminal to which the PMOS transistor PM12 and the NMOS transistor NM22 are commonly connected. The other switch control signals CONA, CONC, and COND are at a low level, and the sense amplifier 400 forms the positive feedback differential amplifier type.

Thus, the data loaded on the bit line BL0 is sensed and amplified compensating for the offset voltage between the drain that is the non-inverted output terminal to which the PMOS transistor PM12 and the NMOS transistor NM22 are commonly connected and the bit line BL0 that is the non-inverted input terminal.

In the period of T4, the switch control signal CONA goes up to a high level, so that the PMOS transistor PM13 is turned off, and the NMOS transistor NM23 is turned on. The switch control signals CONB and COND go up to a high level, so that the NMOS transistors NM24 and NM25 are turned on. The switch control signal CONC is at a low level, so that the NMOS transistor NM26 stays in the turn-off state. Thus, the sense amplifier 400 forms the cross-coupled latch type, and rapidly latches the data amplified in the former step.

Here, the column select signal YI is enabled to a high level, and thus the latched data is provided for the data buses DB0 and DB1.

Figure 4B:
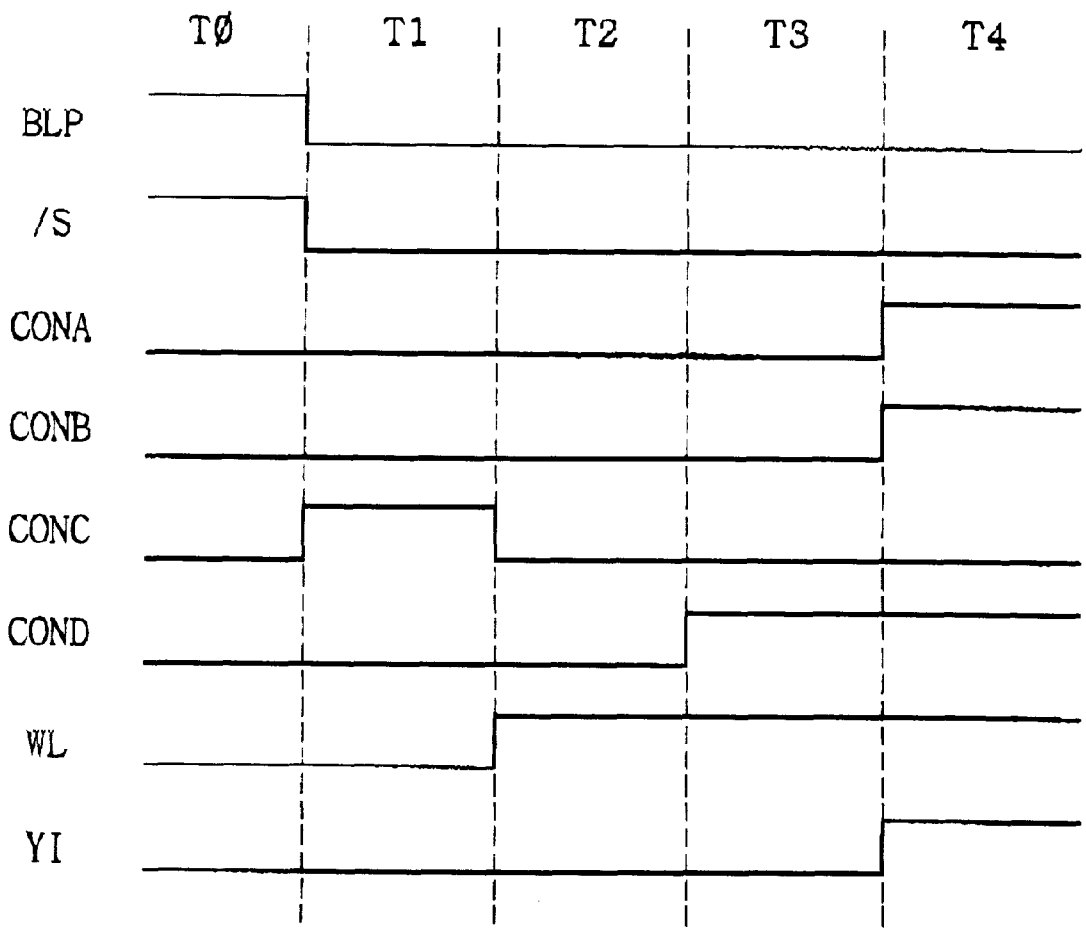
FIG 4B is an operational timing diagram of a case that data is loaded on bit line BL1 shown in FIG. 3.

Meanwhile, FIG. 4B is a timing diagram showing an operation of the semiconductor memory device having the sense amplifier in case that a memory cell connected to the bit line BL1 is selected.

The periods from T0 to T2 have the same operations with the foregoing description. In other words, in the period of T0, the bit lines BL0 and BL1 are precharged. In the period of T1, the sense amplifier 400 is made to be the negative feedback differential amplifier type by that the NMOS transistor NM26 is turned on in response to the switch control signal CONC being turned to a high level, and thus compensates for the offset voltage between the non-inverted input terminal and the inverted output terminal. In the period of T2, the output terminal of the sense amplifier 400 of the normal differential amplifier type is isolated from the bit lines BL0 and BL1, and the data loaded on the bit line BL1 is sensed and amplified.

As shown in FIG. 4B, in the period of T3, the PMOS transistor PM13 is turned on due to the switch control signal CONA of a low level, and thus the sense amplifier 400 forms the differential amplifier type. Since the switch control signal CONC is at a low level, the NMOS transistors NM26 is turned off.

However, unlike the timing diagram shown in FIG. 4, the switch control signal COND goes up to a high level before the control signal CONB, so that the NMOS transistor NM25 is turned on before the NMOS transistor NM24. Thus, the bit line BL1 that is the non-inverted input terminal of the sense amplifier 400 is connected to a drain that is the inverted output terminal to which the PMOS transistor PM11 and the NMOS transistor NM21 are commonly connected, and the sense amplifier 400 forms the positive feedback differential amplifier type.

Hence, the data loaded on the bit line BL1 is sensed and amplified compensating for the offset voltage between the bit line BL1 that is the inverted input terminal of the sense amplifier 400 and the drain that is inverted output terminal where the PMOS transistor PM11 and the NMOS transistor NM21 are commonly connected.

In the period of T4, the switch control signal CONA goes up to a high level, so that the PMOS transistor PM13 is turned off while the NMOS transistor NM23 is turned on. While the switch control signal COND is at a high level, the switch control signal CONB goes up to a high level. Thus, the NMOS transistors NM24 and NM25 are turned on. The switch control signal CONC is at a low level, so that the NMOS transistor NM26 retains the turn-off state. Thus, the sense amplifier 400 forms the cross-coupled latch type, and rapidly latches the data amplified in the former step.

Here, the column select signal YI is enabled to a high level, so that the latched data is provided for the data buses DB0 and DB1.

Likewise, as the selected memory cell is connected to either the bit line BL0 or BL1, a time point for turning on the NMOS transistors NM24 and NM25 is set up correspondingly.

In other words, when the memory cell connected to the bit line BL0 is selected, in the period of T3 with reference to FIG. 4A, the NMOS transistor NM24 is turned on before the NMOS transistor NM25, which compensates for the offset voltage between the bit line BL0 that is the non-inverted input terminal and the drain that is non-inverted output terminal where the PMOS transistor PM12 and the NMOS transistor NM22 are commonly connected, and amplifies the data loaded on the bit line BL0. In the period of T4, while the NMOS transistor NM24 retains the turn-on state, the NMOS transistor NM25 is turned on to latch an overlapped data. Meanwhile, when the memory cell connected to the bit line BL1 is selected, in the period of T3 with reference to FIG. 4B, the NMOS transistor NM24 is previously turned on, which compensates for the offset voltage between the bit line BL1 that is the inverted input terminal and the drain that is the inverted output terminal where the PMOS transistor PM11 and the NMOS transistor NM21 are commonly connected, and amplifies the data loaded on the bit line BL1. In the period of T4, while the NMOS transistor NM25 retains the turn-on state, the NMOS transistor NM24 is turned on to latch the amplified data.

In this manner, the sense amplifier 400 of the present invention controls the MOS transistors PM13, NM23~NM26 that are switch means in response to the switch control signals CONA, CONB, CONC, and COND, sequentially modifies the amplifying method of the sense amplifier 400, and effectively senses and amplifies the data loaded on the bit line BL0 compensating for the offset voltage.

Here, the sense amplifier 400 allows the data loaded on the bit lines BL0 and BL1 to be insensitive to the offset voltage so that the data is sensed and sufficiently amplified in a compensated state of the offset voltage. Further, the offset voltage is not high because the circuit itself is formed by gradually modifying the transistors PM11, PM12, NM21 and NM22.

Moreover, the internal power supply voltage VDD is applied to the sources of the PMOS transistors PM11 and PM12, which doesn't require a circuit (not shown) for generating the sense amp control signal RTO used in the conventional sense amplifier, resulting in decreasing the chip size.

According to the foregoing description, the present invention can improve the sensing sensitivity of the sense amplifier by reducing an effect of the offset voltage, and whereby increasing the cell density and achieving the stable operation in low voltage.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor memory device with a sense amplifier for, when enabled in response to a sense amp control signal, sensing and amplifying bit data loaded on a bit line using a predetermined power supply voltage, the sense amplifier comprising:

a plurality of switch means for causing the amplifier to operate in a plurality of modes of amplifying the data in response to a plurality of switch control signals while the sense amplifier is enabled, wherein the amplifying modes of the sense amplifier include: (a) negative feedback differential amplifying, (b) normal differential amplifying, (c) positive feedback differential amplifying, and (d) cross-coupled latch type amplifying, in sequence.

2. The semiconductor memory device of claim 1, wherein the switch means isolates an output terminal of the sense amplifier from the bit line when the sense amplifier operates in a normal differential amplifying mode.

3. The semiconductor memory device of claim 2, wherein the switch means compensates for an offset voltage between input and output terminals of the sense amplifier when the sense amplifier operates in a negative feedback differential amplifying mode.

4. The semiconductor memory device of claim 2, wherein the switch means compensates for an offset voltage between input and output terminals of the sense amplifier when the sense amplifier operates in a positive feedback differential amplifying mode.

5. A method for driving a sense amplifier sensing and amplifying data loaded on a bit line in a semiconductor memory device, the method sequentially comprising the steps of:

turning an amplifying method of the sense amplifier into a negative feedback differential amplifying method and compensating for an offset voltage between input and output terminals;

turning an amplifying method of the sense amplifier into a normal differential amplifying method and amplifying the data loaded on the bit line;

turning an amplifying method of the sense amplifier into a positive feedback differential amplifying method, compensating for an offset voltage between the input and output terminals, and re-amplifying the data amplified in the normal differential amplifying step; and turning an amplifying method of the sense amplifier into a cross-coupled latch method and latching the data amplified in the positive feedback differential amplifying step.

6. The method of claim 5, wherein the positive feedback differential amplifying step amplifies the data loaded on the bit line to compensate for the offset voltage between a non-inverted input and output terminals when the data is loaded on the bit line connected to the non-inverted input terminal of the sense amplifier.

7. The method of claim 5, wherein the normal differential amplifying step amplifies the data loaded on the bit line when the output terminal of the sense amplifier is being isolated from the bit line.

8. The method of claim 5, wherein the positive feedback amplifying step amplifies the data loaded on the bit line to compensate for the offset voltage between inverted input and output terminals when the data is loaded on the bit line connected to the inverted input terminal of the sense amplifier.

* * * * *